United States Patent [19]

Engeler et al.

[11] Patent Number: 5,047,770
[45] Date of Patent: Sep. 10, 1991

[54] APPARATUS FOR TESTING DATA CONVERSION/TRANSFER FUNCTIONS IN A VIBRATORY ENERGY IMAGING SYSTEM

[75] Inventors: William E. Engeler, Scotia; Matthew O'Donnell, Schenectady; John J. Bloomer, Schenectady; John T. Pedicone, Schenectady, all of N.Y.

[73] Assignee: General Electric Company, Schenectady, N.Y.

[21] Appl. No.: 518,595

[22] Filed: May 3, 1990

[51] Int. Cl.$^5$ ............................................. H03M 1/10
[52] U.S. Cl. ................................. 341/120; 364/571.01
[58] Field of Search .............. 341/120, 118, 155, 122, 341/111, 123, 124, 125; 364/571.07, 571.05, 571.04, 571.01; 371/16.1

[56] References Cited

U.S. PATENT DOCUMENTS

| | | | |
|---|---|---|---|
| 3,681,577 | 8/1972 | Gasiunas | 341/120 |
| 4,839,652 | 6/1989 | O'Donnell et al. | 341/122 |
| 4,896,282 | 1/1990 | Orwell | 364/571.05 |
| 4,903,026 | 2/1990 | Tiemann et al. | 341/131 |
| 4,983,970 | 1/1991 | O'Donnell et al. | 341/122 |

Primary Examiner—A. D. Pellinen
Assistant Examiner—B. K. Young
Attorney, Agent, or Firm—Marvin Snyder; James C. Davis, Jr.

[57] ABSTRACT

Apparatus for testing data conversion/transfer functions in each of a plurality N of channels of a vibratory energy imaging system includes a multiplexer for providing, to an addressable memory having a plurality of $L = 2^M$ locations in each of which a data word of B bits can be stored, a selected one of an input data word and a test data word, each of which can address one of the L locations of the memory means. The address multiplexer facilitates retrieval from memory of a B-bit data word having a value selected to implement a selected function for that channel, so that comparision of data from the selected test address with the data which has been sent to that location for storage, will indicate if proper data is stored for carrying out the designated function.

7 Claims, 3 Drawing Sheets

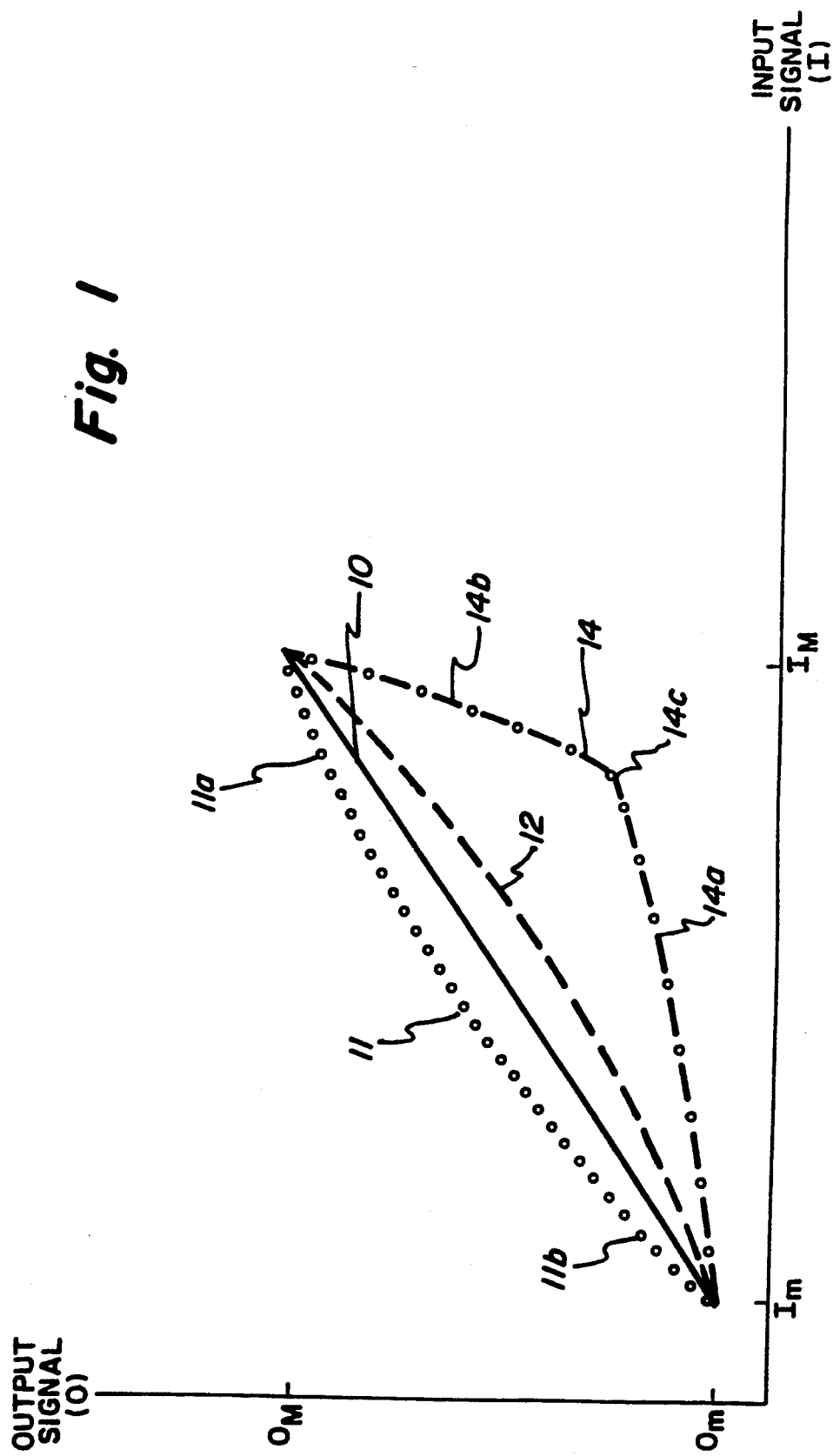

APPARATUS FOR TESTING DATA CONVERSION/TRANSFER FUNCTIONS IN A VIBRATORY ENERGY IMAGING SYSTEM

BACKGROUND OF THE INVENTION

The present invention relates to coherent imaging systems using vibratory energy, such as ultrasonic or electromagnetic waves, and, more particularly, to novel apparatus for testing of data conversion, data transfer and the like functions in at least one channel of a vibratory energy imaging system.

Methods and apparatus for fully digital beam formation in phase-array coherent imaging systems are now well known; one such system, for use in ultrasonic medical imaging and the like, is described and claimed in U.S. Pat. No. 4,839,652, issued June 13, 1989, assigned to the assignee of the present application and incorporated herein in its entirety by reference. Such an imaging system utilizes a phased array sector scanner (PASS) to rapidly and accurately sweep a formed beam of vibratory energy. The desired beam pointing accuracies are obtained by maintaining an accurate set of phase relationships, which are, in fact, a set of time delays between the various ones of a plurality N of transducer elements of the PASS array. By decoupling the required phase accuracy and time delay accuracy from one another, the signals can be coherently summed with greater accuracy. However, proper beam formation requires that both the necessary time resolution and amplitude resolution be provided in each channel, so that the at least one analog-to-digital converter (ADC, utilized for converting the analog RF signal from each channel transducer, at any instant, into a digital data word for processing) in each channel carry out conversions at a sample frequency of at least two times, and usually four times, the maximum operating imager frequency. In an ultrasonic medical imager utilizing signals of up to 10 MHz, each of the N channels (where N may on the order of 64) requires the use of at least one ADC of 7 or 8 bit output resolution, and operates at a 20 or 40 MHz sampling rate; those skilled in the art will immediately utilize that seven or eight bit ADC resolution is insufficient to provide the at least 70 dB of instantaneous dynamic range required in each channel of the imaging system. A mixed analog/digital system (i.e. an analog time gain control circuit or TGC, compression analog amplifier and the like, utilized with an ADC and a subsequent digital baseband subsystem, including an expansion digital random access memory (RAM) look-up remap stage) allows the instantaneous system dynamic range to be increased to the desired level. We use preselected nonlinear compressive/expansive complementary functions to provide a desired inversion function simultaneously with the ability to remove many other system nonlinearities, and also both to remove certain classes of nonlinearities generated by imperfections in the apparatus of each of the plurality N of channels in the system and correct for channel-to-channel differences. It is now highly desirable to provide apparatus which allows testing of the remapping circuits in each channel of the imaging system.

BRIEF SUMMARY OF THE INVENTION

In accordance with the invention, apparatus for testing data conversion, data transfer and the like functions in each of a plurality N of channels of a vibratory energy imaging system, includes a test block coupled between an addressable memory, storing in each of its L locations a data word having a value selected to map an output data signal of that channel as a desired function of a present input signal; with means for selecting that one of the L data word locations, responsive to a test signal, from which to read and verify stored data. Thus, in one typical system use (in which the analog RF signal from each channel transducer is compressed prior to analog-to-digital conversion, to map the large instantaneous dynamic range of the channel signal into the dynamic range of an M-bit ADC, and is operated upon, or remapped, by an inverse (expansion) function to return the digital data of the ADC output to a linear scale, so that a linear filtering chain can be used to form the coherent sum across the system aperture), a remap static random access memory (SRAM) is used to account for analog gain variations (including ADC conversion variations) between the different channels of the system, by reference to a test signal generator for providing the actual transfer function for that channel's analog front-end circuitry, with the M-bit ADC output signal being utilized to input a SRAM memory location in which is stored data providing a digital data word which is linearly related to the analog RF value causing the M-bit data word to address that location, so that the output data for all selected analog values is the same in each of the N channels. The novel test section is placed between the ADC and the SRAM to provide a digital test point for monitoring the ADC output and for facilitating data loading into SRAM storage.

In a presently preferred embodiment of our novel method and apparatus, a test block is included in each of N=128 channels with a similar front-end portion, each with a compression amplifier, a single ADC, a digital demodulator and rate-reduction means (including a digital demodulator means, digital low-pass filtering means, digital decimation means, digital delay means and the like) and channel control logic means, which can all be separate or can be integrated into a semiconductor monolithic circuit, if desired.

The foregoing invention will be described with particular emphasis on one energy form, e.g. ultrasonic mechanical vibrations, in a presently preferred embodiment; it should be understood that this energy form is exemplary and not delimiting.

Accordingly, it is an object of the present invention to provide novel apparatus for testing data conversion and/or data transfer functions in each of a plurality of channels providing a digital baseband representation of a received vibrator energy beam.

This and other objects of the present invention will become apparent to those skilled in the art upon reading of the following detailed description of the invention, when considered in conjunction with the appended drawings.

BRIEF DESCRIPTION OF THE DRAWINGS

FIG. 1 is a graph illustrating the desired linear input/output relationship, and various non-linear signal relationships engended by various causes during the operation of each system channel.

DETAILED DESCRIPTION OF THE INVENTION

Figure 2A:
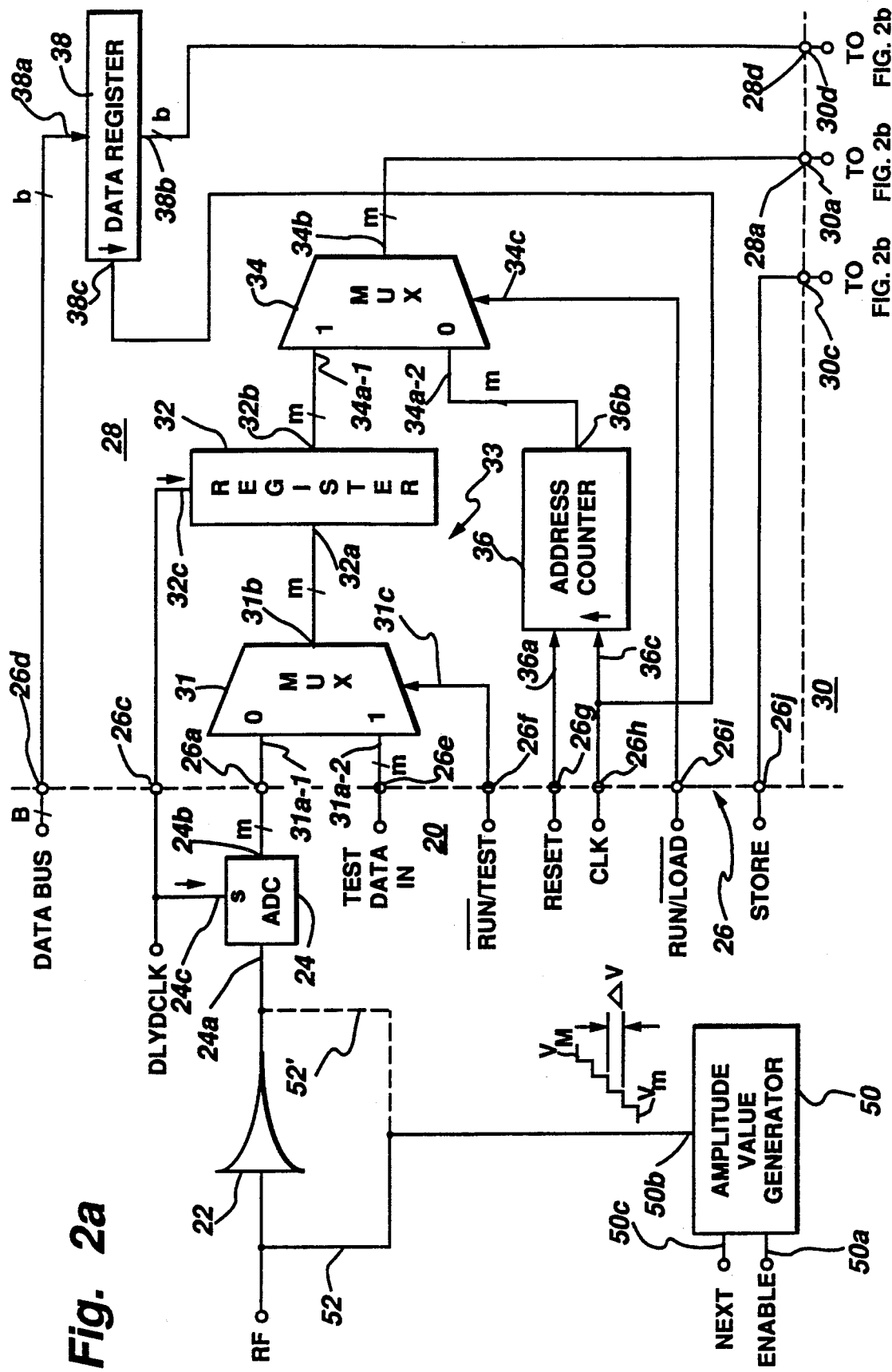
FIGS. 2a and 2b together make up a schematic block diagram of apparatus forming a portion of each of the N channels of the system, and particularly including novel test circuitry in accordance with the principles of the present invention.

Referring initially to FIG. 1, a graph is shown in which amplitude of an input signal I is plotted along the abscissa, from a minimum input amplitude $I_m$ to a maximum input amplitude $I_M$, and amplitude of an output signal O appears along the ordinate, from a minimum output amplitude $O_m$ to a maximum output amplitude $O_M$. An ideal channel transfer function is graphed by solid line 10 as a straight line representing a linear analog RF signal input-to-output data relationship. In order to solve the instantaneous dynamic range problem, analog compression prior to the ADC utilizes a non-linear function, as shown by the dotted-line 11 transfer function, so that relatively large changes in input amplitude near the maximum $I_M$ portion 11a provide the same magnitude of output change as would be provided by much smaller input changes near the minimum input $I_m$ portion 11b of the curve. This compression function is later corrected for by the use of the non-linear inverse relationship illustrated by the broken-line curve 12. One example uses the function log $O = k$ log $I$, where k is about 0.06, for curve 11; the opposite curve 12 would utilize a constant k' of 5/3. The foregoing is now known to those skilled in the art. Also known is the presence of other unwanted nonlinearities in each channel. Due to nonlinearities in the ADC, compression amplifier and/or other analog circuits in the front-end of each channel, some arbitrarily non-linear transfer curve, such as the chain-line curve 14 may actually occur; curve 14 has a plurality of segments (here a pair of segments 14a and 14b) which may themselves be non-linear, and may have rather abrupt breakpoints (such as the breakpoint 14c) therebetween. In accordance with a first principle of the present invention, we have found that the various analog nonlinearities, and channel-to-channel analog differences (such as in the various gains, compression points and the like) can be substantially removed by recording the digital data output signal which should ideally linearly correspond to a given analog RF input signal, and providing the final digital data word from storage whenever the ADC output digital data provides a corresponding value, as a memory addressing function. Thus, any monotonic transfer (i.e. input-to-output) function 14 can be converted to a function 10 with a desired degree of linearity.

Figure 2B:
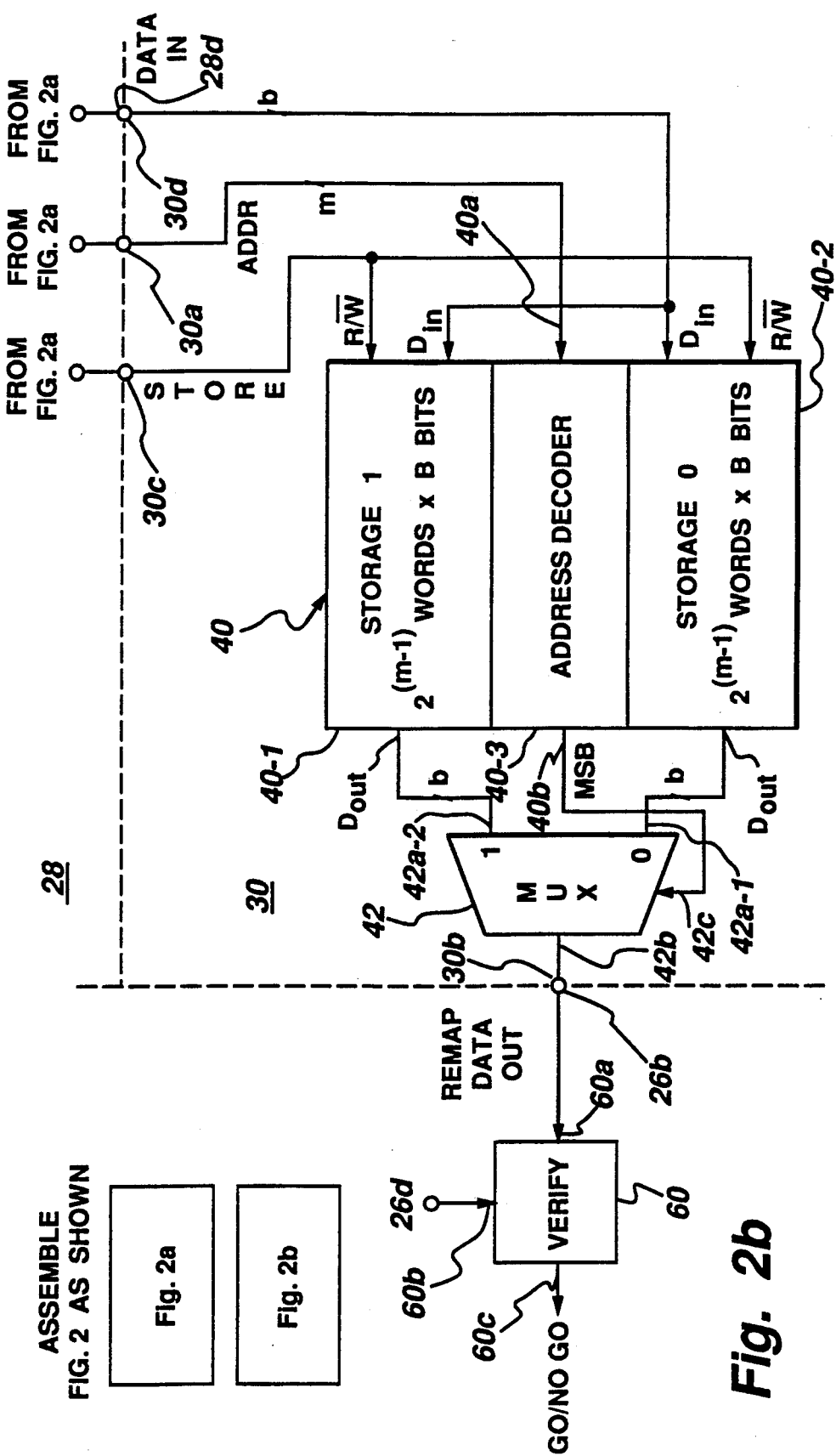

Referring now particularly to FIGS. 2a and 2b, in a front-end subassembly 20 for each of the plurality N of channels in the multi-channel vibratory energy beam imaging apparatus, the analog RF (ultrasound) energy from the transducer (and from any intervening (i.e. transmit/receive) switching means, time-gain-control amplifier and the like) of that single channel is provided to a compression amplifier means 22. The compressed analog signal appears at an analog input 24a of an analog-to-digital converter ADC means 24, which provides a multiple bit output data word of m bits width at a digital data output port 24b, responsive to each occurrence of a strobe signal at a strobe input 24c. In an illustrative system, a 7 bit flash ADC might sample an RF signal of up to 8 MHz at a 20 MHz sample rate. The m-bit-wide data word of each sample is provided to a first input 26a of a digital remap means 26, configured in accordance with the principles of the present invention. The digital remap means 26 provides corrected and linearized digital data at an output data port 26b. A remapped (i.e. corrected) digital data word is provided at output 26b for that uncorrected digital data word then present at input 26a when one of a multiplicity of sequential clock signals is provided at a clocking input 26c; here, one edge, e.g. the following (falling) edge, of a delayed clock DLYDCLK signal (also used to provide another, earlier edge utilized for strobing ADC 24) provides the remap clock signal at input 26c. Data for storage is provided on a data bus to an input 26d of the remap means. The digital remapping means 26 includes an input means 28 and a random-access memory (RAM) means 30, which may include static or dynamic RAM.

In accordance with the invention, means 28 includes a first multiplexer (MUX) means 31 and a register means 32, which form a test section 33. The test multiplexer (MUX) means 31 has a zero-select first input 31a-1 receiving the m-bit-wide digital data words from the ADC output, via remap means input 26a. A one-select second input 31a-2 facilitates input of test data words from a remap means input 26e. The first MUX means output 31b provides an m-bit-wide data word selected from the data words at one of inputs 31a-1 or 31a-2 dependent on the logic level of a data bit at a MUX control input 31c, which is connected to a TEST control input 26f. In accordance with the present invention, if the TEST signal at input 26e provides a logic one, or test, value to input 31a-2, the one-selected input 31a-2 is connected to output 31b and test data from input 26f is provided to an input 32a of an m-bit register means 32. Conversely, in the "normal" or "non-test" condition, a logic-zero bit is provided to input 31a-2, and the ADC output data word is provided through read/test word-select MUX means 31 to input 32a of the register means 32. The selected (ADC output or test data) address data word at input 32a is clocked into the register and provided at a register output 32b responsive to a predetermined edge of the clock waveform at register means clock input 32c; here, this selected edge would be the later (opposite) edge of the delayed clock DLYDCLK waveform having an earlier waveform edge utilized as the strobe S signal in ADC means 24. That is, in each binary delayed clock signal cycle, the first edge causes a sample to be converted to a digital data word, and the second edge of that cycle causes the data to be read into register means 32 from ADC output 24b.

The m-bit-wide data word at the test block 33 output, i.e. at register means output 32b, appears at a one-select first input 34a-1 of a second multiplexer (MUX) means 34, having a zero-select second input 34a-2 connected to the output 36b of an m-bit address counter means 36. Address counter means 36 has a reset input 36a which receives a reset signal from SRAM means input 26g and receives a clock CLK signal from another input 26h. The m-bits of the data word at address counter output 36b will appear at the second (load/run) MUX means output 34b if the logic state of a normal/load select signal at another SRAM means input 26i provides a logic-zero signal to the second MUX means control input 34c; if a logic-one bit is provided at input 34c, the ADC 24b output data from register means output 32b is provided at MUX means 34 output 34b and thence to input means address ADDR output port 28a.

A data register 38 has a b-bit-wide data word input port 38a receiving b-bits of parallel data from data bus input 26d for temporary storage and for providing the data at an output port 38b, both responsive to an edge of the clock CLK signal provided from input 26h to a register clock input 38c; the storage operation is performed responsive to the later opposite edge of the clock CLK waveform from the earlier edge used to advance the count in address counter means 36. The b-bit-parallel data word is provided from data register output 38b to an input means data output port 28d.

The RAM portion 30 has an address ADDR word input port 30a and data DATA IN word input port 30d respectively providing m-bit-wide and b-bit-wide data signals to a memory means 40. In one presently preferred configuration, the actual random access memory 40 comprises first and second storage blocks 40-1 and 40-2, denominated STORAGE 0 and STORAGE 1, each having static storage for $L=2^{(m-1)}$ words of B bits (e.g. 64 words of 10 bits each, where m=7 and B=10 in the illustrated embodiment). The two data storage blocks 40-1 and 40-2 share a common address decoder means 40-3, which decodes the (m-1) lower bits of the m-bit address word into one of $2^{m-1}$ addresses and selects that address in both blocks 40-1 and 40-2; the highest bit of the address word selects block 0 or block 1 by its logic state. Thus, the address ADDR information is simultaneously applied in parallel to the input 40a of the RAM means, while the b-bit-wide input data is supplied to data inputs $D_{in}$ of both blocks and is stored within the appropriate one of blocks 40-1 or 40-2 as selected by address decoder 40-3 (e.g. block 0 selected by MSB=0 and block 1 selected by MSB=1, where MSB is the most significant bit) responsive to a STORE (write) low-logic-level command received at the memory read/write (R/$\overline{\text{W}}$) input from a RAM means input 30c. When input 30c receives a read (high-logic-level) command, data is provided at each of the two output data $D_{out}$ ports from a location within the associated one of the two storage blocks; the selection of the internal location is dependent upon the address data word then provided at input 40a. Proper output data is present only at that one of the two storage blocks determined by the then-present value of the most significant bit (MSB) of the address data; the MSB value is carried through the decoder means 40-3 and is provided at address decoder output 40b. This MSB value is provided to the control bit 42c of a third MUX means 42, receiving the output data from one storage block 40-2 at a first, or zero-select, input 42a-1 and the output data of the other storage block 40-1 at the one-select second input 42a-2. The block selected by the MSB signal provides the data at the MUX means output 42b, which is also the RAM output 30b and the remap means output port 26b.

An amplitude value generator means 50 may be provided, and, if used, receives an enable signal 50a to provide a RF signal of known frequency and known amplitude at an output 50b. When initially enabled, the signal at output 50b has a first (typically zero) amplitude. The "amplitude", i.e. the size of the signal sampled by the ADC, is increased by a substantially fixed amount $\Delta V$ in step-wise manner whenever a next-step NEXT signal is provided at a control input 50c. The NEXT signals may be provided in a manner selected to cause each RF signal to appear at a rate commensurate with the frequency of normal operation of the channel. Thus, the amplitude of the RF signal at output 50b can be stepped from a minimum value to a maximum value in essentially equal steps of size $\Delta V$, and this step-wise analog signal can be provided, as required, to various points within the analog front-end of each channel 20. As shown, the stepped signal is provided via connection 52 to the input of compression amplifier 22, although other connections, such as via connection 52' to the ADC input and at other analog locations within each channel, can be individually programmably provided as required.

Operation of the digital remap means 26 can commence by initially loading address data in RAM 40, responsive to a logic-one pulse at reset input 26g, followed by a logic-zero load and one cycle of the clock CLK signal at input 26f for each RAM location. Thus, address counter 36 is first reset to a zero count by a logic-one pulse at input 26g and is then enabled, by input 26g returning to the logic-zero state, to up-count responsive to each pulse of the CLK signal at input 26h. The successively greater values of the address word count at counter output 36b are applied via second MUX 34 (due to a logic-zero load level at control input 34c, from input 26i), to the RAM means ADDR input 30a. A selected b-bit-wide input data word is provided to input 26d and is latched into register 38 on the later edge of that CLK pulse which advanced the address count, in counter means 36, on an earlier edge. The STORE bit signal at input 26j then goes to a low logic ($\overline{\text{w}}$) level to enable writing of data into RAM 40 and the data word at input port 30d is stored at the RAM location having the address then present at ADDR port 30a. The CLK signal is cycled and a next-sequential address count appears at counter output 36b, and at port 30a. Responsive to each new address word, the STORE level is cycled to cause a new data word from input 26d (as temporarily stored within the data register 38, and provided at the output 38b thereof) to be then stored in RAM means 40.

Our novel test block can be used to comparison-test the contents of the digital remap means 26 by applying a desired (random, successive or other selected) sequence of values of m-bit address data words to the test data input 26e, while the test input 26f is at a logic one value; each cycle of the DLYDCLK clock signal then provided at input 26c causes the present test address to be entered into register 32. The signal at RUN/$\overline{\text{LOAD}}$ input 26i is now a logic-one (run) level, so that the last address word at register output 32b passes through second MUX 34 (from input 34a-1 to output 34b) and is applied to address decoder 40-3. The STORE signal at input 30c is kept at a high logic (READ) level. The data word stored at the test address appears at remap means output 26b and at one input 60a of a verification means (e.g a data comparator) 60, allowing verification of its value against the data value originally applied at input 26d for that address and now applied to the other input 60b of the verification means; if a good storage action has occurred, verification means output 60c is at a desired logic level, which is sensed and acted upon by the system controller (not shown).

Having tested the digital remap means storage capability, the actual input/output function for the particular channel can now be mapped into means 26. Amplitude value generator 50 is enabled and the initial (e.g. zero) RF amplitude is applied to the channel input, and is converted to a digital data word. Responsive to a logic-zero (RUN) level at input address 26e, the ADC output data word appears at register 32 and is stored therein when first MUX means 31 responds to the proper (e.g. falling) DLYDCLK signal edge. As the logic signal at input 26i is now high (in the RUN state), this digital word passes through the second MUX means to appear at ADDR terminals 28a/30a and RAM address decoder input 40a. Simultaneously, new first-value input data are provided at data bus input 26d (corresponding to the desired output value for the first value of RF signal amplitude at generator output 50*b*); these data are latched into register 38 when the CLK signal (at input 26*h*) cycles and then into storage means 40 when the signal at input 26*j* cycles. The next-increment input 50*c* of the generator means 50 is enabled and the next amplitude applied in the analog portion of the channel, to provide a new ADC means output word which provides the next address at which is stored a data word, provided at input 26*d*, commensurate with the desired output signal for the step at which generator 50 is then providing its RF output signal. These new data are likewise stored at a unique location determined by the address then present at RAM means 40, which present address is the present digital da word output from the ADC means. In this manner, the entire range of amplitude values are generated and the associated individual addresses are utilized to map the associated single data word of true data into storage means 40, o that a linear analog RF input/digital data word output set of values is stored. After calibration in this manner, the memory can be probed by external means, such as a microcomputer and the like, to search for any missing codes. If missing codes are generated in calibration, these memory locations can be written externally, using an interpolated value determined by data in the vicinity of the missing data code. The channel can now be operated in normal-run manner by latching the signal at input 26*j* to the high (READ) level; the signal at input 26*f* is low and the signal at input 26*i* is high. The output data is then dependent upon, and is a predetermined function of, the analog input signal in that channel.

While one presently preferred embodiment of our novel invention has been described in detail herein, many modifications and variations will now become apparent to those skilled in the art. It will be especially seen that our test block can be used in other channel architectures and that other methods of operation can be used with any channel containing our test block. It is our intent, therefore, to be limited only by the scope of the appended claims and not by the specific details and instrumentalities presented by way of explanation herein.

What we claim is:

1. Apparatus for testing a data conversion/transfer function in at least one of a plurality N of channels of a vibratory energy imaging system, each of said channels being implemented by an addressable memory having a plurality $L=2^m$ locations, where m is the number of bits in an address data word addressing any one of said L locations, each of said L locations being capable of storing an input data word of b bits therein, said apparatus comprising:

means for providing an input data word for storage in said addressable memory;

means for providing a selected test data word to address a predetermined one of the L locations of the addressable memory, said test data word corresponding to the address of the location at which said input data word is being stored; and a register for temporarily storing the selected test data word prior to application to said addressable memory;

whereby said test data word can initiate readout of said input data word from said addressable memory.

2. The apparatus of claim 1, further comprising means for comparing the contents of the memory location addressed by the test data word with said input data word after said input data word has been sent to said memory location for storage, to verify that the input data word is in fact stored at the addressed memory location.

3. The apparatus of claim 2, wherein said means for providing a selected test data word comprises means for generating a plurality of test data words in a random sequence.

4. The apparatus of claim 2, wherein said means for providing a selected test data word comprises means for generating a plurality of test data words in a preselected order.

5. The apparatus of claim 1, wherein said register comprises a clocked register to allow the selected test data word to be applied to said addressable memory only after occurrence of a predetermined clock signal.

6. The apparatus of claim 1, wherein said means for providing a selected test data word to address a predetermined one of the L locations of the addressable memory comprises an address data multiplexer.

7. The apparatus of claim 6 including means for forcing to a predetermined condition any address data word supplied to said multiplexer.

* * * * *